United States Patent
Hsieh

(10) Patent No.: US 11,462,638 B2
(45) Date of Patent: Oct. 4, 2022

(54) SIC SUPER JUNCTION TRENCH MOSFET

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 11 days.

(21) Appl. No.: 17/073,432

(22) Filed: Oct. 19, 2020

(65) Prior Publication Data
US 2022/0123140 A1  Apr. 21, 2022

(51) Int. Cl.
| | |
|---|---|
| H01L 21/04 | (2006.01) |
| H01L 29/16 | (2006.01) |
| H01L 29/66 | (2006.01) |
| H01L 29/78 | (2006.01) |
| H01L 29/06 | (2006.01) |
| H01L 29/10 | (2006.01) |
| H01L 29/417 | (2006.01) |
| H01L 29/423 | (2006.01) |
| H01L 29/45 | (2006.01) |

(52) U.S. Cl.
CPC ........ *H01L 29/7813* (2013.01); *H01L 21/047* (2013.01); *H01L 21/049* (2013.01); *H01L 29/0634* (2013.01); *H01L 29/1095* (2013.01); *H01L 29/1608* (2013.01); *H01L 29/41741* (2013.01); *H01L 29/4236* (2013.01); *H01L 29/42368* (2013.01); *H01L 29/45* (2013.01); *H01L 29/66068* (2013.01)

(58) Field of Classification Search
CPC ..... H01L 21/04; H01L 21/046; H01L 21/047; H01L 21/049; H01L 29/1095; H01L 29/1608; H01L 29/66; H01L 29/66068; H01L 29/78; H01L 29/7813
USPC .......................................................... 257/77
See application file for complete search history.

(56) References Cited

U.S. PATENT DOCUMENTS

| | | | |
|---|---|---|---|
| 8,829,607 B1* | 9/2014 | Hsieh | H01L 29/0623 257/334 |
| 2012/0175699 A1* | 7/2012 | Hsieh | H01L 29/41766 257/E27.06 |
| 2017/0338302 A1* | 11/2017 | Hsieh | H01L 29/66734 |
| 2019/0206988 A1* | 7/2019 | Padmanabhan | H01L 29/66712 |
| 2021/0384346 A1* | 12/2021 | Hsieh | H01L 29/407 |

* cited by examiner

*Primary Examiner* — Fazli Erdem
(74) *Attorney, Agent, or Firm* — Bacon & Thomas, PLLC

(57) ABSTRACT

A SiC SJ trench MOSFET having first and second type gate trenches for formation of gate electrodes and super junction regions is disclosed. The gate electrodes are disposed into the first type gate trenches having a thick oxide layer on trench bottom. The super junction regions are formed surrounding the second type gate trenches filled up with the thick oxide layer. The device further comprises gate oxide electric field reducing regions adjoining lower surfaces of body regions and space apart from the gate trenches.

7 Claims, 17 Drawing Sheets

SIC SUPER JUNCTION TRENCH MOSFET

FIELD OF THE INVENTION

This invention relates generally to semiconductor devices, and more particularly, to a silicon carbide (SiC) super junction (SJ) trench MOSFET (Metal Oxide Semiconductor Field Effect Transistor) having a thicker oxide layer at the trench bottom and a p type doping region surrounding lower portion of trenches forming a SJ structure above substrate, to achieve a lower electric field strength of the gate oxide, lower on-resistance, smaller gate-drain charge (Qgd) and lower switching loss.

BACKGROUND OF THE INVENTION

Because of the physical properties of SiC, SiC-MOSFETs can achieve a higher breakdown voltage, lower on-resistance and higher switching speed than Si-MOSFETs. However, SiC-MOSFETs have a higher electric field strength at the gate oxide than Si-MOSFETs because of poor interface state between SiC and the gate oxide requiring higher Vgs to fully turn on device channel. E.g. for Si device, Vgs=10V can fully turn on the Si device channel but for SiC requires Vgs=18V. The higher Vgs causes higher electric filed strength at gate oxide resulting in reliability issue.

Another issue is gate oxide grown at trench bottom of SiC device is much thinner than trench sidewalls (about 3-5 times thinner) as shown in FIG. 1, not only causing higher Qgd but also making much higher gate oxide electric field strength at trench bottom. The device structure in the FIG. 1 is similar to conventional Si Trench MOSFET except N+ SiC substrate 101 and SiC epitaxial layer 102, having n+ source region 111 and P body region 110. A gate trench 103 filled up with gate electrode 105 is formed in the epitaxial layer 102 having a thermally grown gate oxide 109 on trench sidewalls and a 106 on trench bottom. The gate oxide thickness of the gate oxide 106 is less than the 109 as result of oxidation rate of trench bottom on Si plane is lowest in crystal plane of SiC.

Therefore, there is still a need in the art of the semiconductor device design and fabrication, particularly for SiC trench MOSFET design and fabrication, to provide a novel cell structure, device configuration and manufacturing process that making a SiC trench MOSFET has lower electric field strength of the gate oxide, achieve lower on-resistance, smaller Qgd and lower switching loss.

SUMMARY OF THE INVENTION

The present invention discloses a SiC SJ trench MOSFET having first and second type gate trenches for formation of gate electrodes and SJ regions, wherein the gate electrodes disposed into the first type gate trenches having a thick oxide layer on trench bottom, and a p type doping region surrounding the second type gate trenches forming a SJ structure above substrate. The new device features not only reduce electric field strength of the gate oxide but also reduce the on-resistance as result of the super junction formation. The device further comprises gate oxide electric field reducing p type regions adjoining lower surfaces of body regions and space apart from the trenches. Moreover, as a unipolar device, the switching loss of SiC MOSFET should be lower than that of an IGBT. Because of a thicker bottom oxide layer of the device, it should be capable of achieving a smaller Qgd as well as further reductions in switching loss compared to a conventional SiC MOSFET.

According to one aspect, the invention features a SiC power device comprising an SJ trench MOSFET formed in an epitaxial layer of a first conductivity type onto a substrate of the first conductivity type, further comprising: a plurality of trenches surrounded by source regions of the first conductivity type encompassed in body regions of a second conductivity type near a top surface of the epitaxial layer in active area; each of the trenches has a first type gate trench and a second type gate trench; the first type gate trench is above the second type gate trench and has a trench width wider than the second type gate trench; a gate electrode is disposed in the first type gate trenches surrounded with a first insulating film on bottom of the trenches and a second insulating film on sidewalls of the trenches; the first insulating film has a thickness greater than the second insulating film; a super junction region is surrounding with lower portions of the trenches, comprising a first doped column region of the second conductivity type formed adjacent to sidewalls of the second type gate trenches and a second doped column region of the first conductivity type formed in parallel and surrounded with the first doped column regions; the second type gate trenches are filled up with the first insulating film; the body regions and the source regions being shorted to a source metal through a plurality of source contacts.

According to another aspect, in some preferred embodiments, the epitaxial layer comprises a single epitaxial layer having uniform doping concentration. In some other preferred embodiments, the epitaxial layer comprises a lower epitaxial layer between the substrate and the super junction region with resistivity R1 and an upper epitaxial layer with resistivity R2, wherein R1<R2.

According to another aspect, in some preferred embodiment, the source contacts are trenched contacts.

According to another aspect, the present invention also features a trenched semiconductor power device further comprising gate oxide electric field reducing regions of the second type conductivity adjoining lower surfaces of the body regions and space apart from the trenches.

According to another aspect, in some preferred embodiments, the source contacts are filled with Ti/TiN/Al alloys. In some other preferred embodiments, the source contacts are filled with Ti/TiN/W.

The present invention also features a method for manufacturing a SiC power device comprising the steps of: growing an epitaxial layer of a first conductivity type onto a substrate of the first conductivity type, wherein the epitaxial layer has a lower doping concentration than the substrate; forming first type and second type gate trenches by performing the following steps: (a) forming a trench mask onto a top surface of the epitaxial layer for definition of a plurality of first type gate trenches; (b) forming the first type gate trenches in the epitaxial layer by etching through open regions in the trench mask; (c) forming a dielectric layer on sidewalls and bottoms of the first type gate trenches; (d) removing the bottoms of the first type gate trenches by anisotropic etch; (e) performing an anisotropic silicon etch to form a plurality of second type gate trenches.

According to another aspect, in some preferred embodiment, the method for manufacturing a trench semiconductor power device further comprising the steps of: carrying out an angle ion implantation of the second conductivity type dopant into the sidewalls and bottoms of the second type gate trenches to form a second conductivity type doped region surrounding the second type gate trenches.

According to another aspect, in some preferred embodiment, the method for manufacturing a trench semiconductor power device further comprising the steps of: a zero-degree ion implantation of the second conductivity type dopant.

According to another aspect, in some preferred embodiment, the method for manufacturing a trench semiconductor power device further comprising the steps of: depositing a BSG layer into the trenches after step (e) to form a second conductivity type doped region surrounding lower portion of the trenches.

According to another aspect, in some preferred embodiment, the method for manufacturing a trench semiconductor power device further comprising the steps of: (f) forming a first insulating film along inner surfaces of the first type and the second type gate trenches, wherein the second type gate trenches is filled up by the first insulation film; (g) etching back the first insulating film from upper portion of the first type gate trenches; (h) forming a second insulating film as a gate oxide layer on sidewalls of the trenches; (i) depositing a doped poly-silicon layer into the first type gate trenches; (j) etching back the first doped poly-silicon to form a gate electrode.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
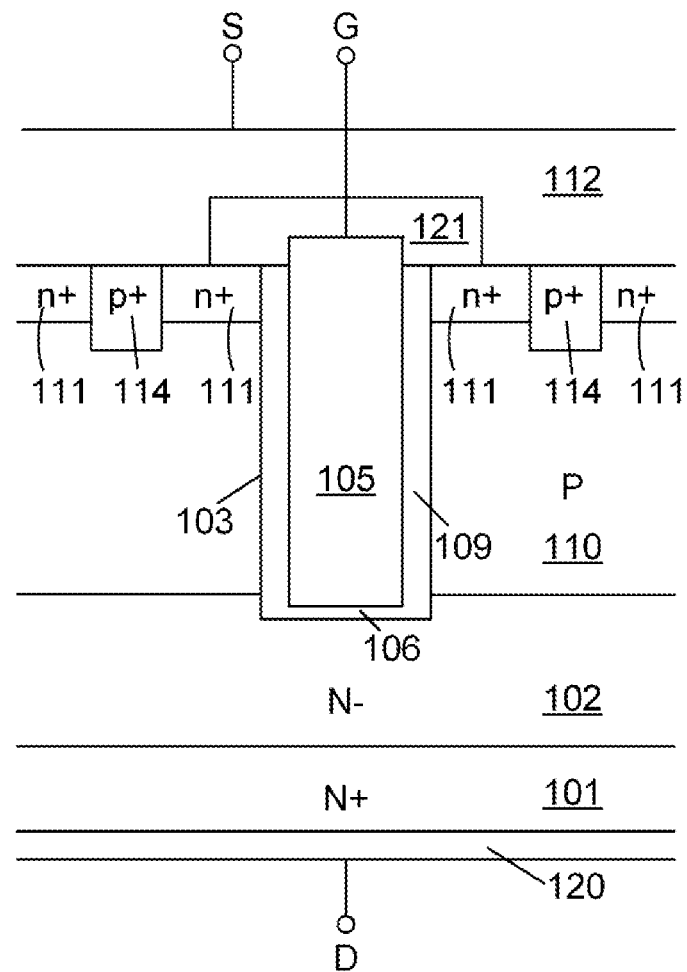
FIG. 1 is a cross-sectional view of a conventional SiC semiconductor device having a trench gate vertical double diffused MOSFET.
Figure 2A:
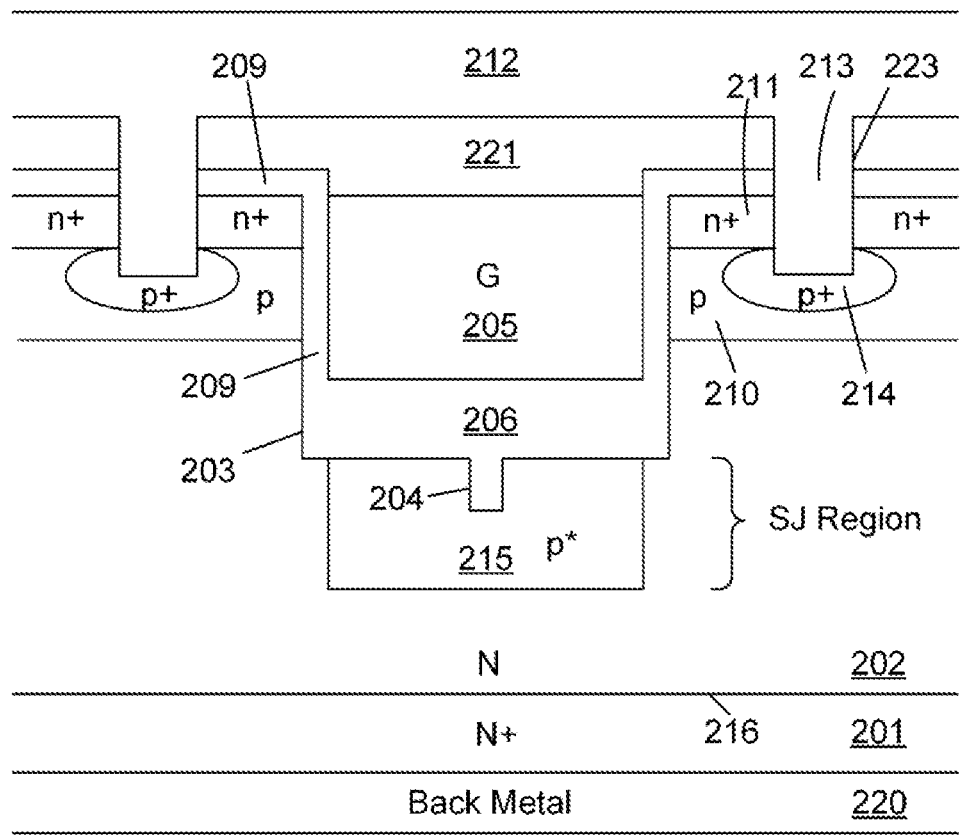
FIG. 2A is a cross-sectional view of a preferred embodiment according to the present invention.

Please refer to FIG. 2A for a preferred embodiment of this invention. A SiC power device comprising an SJ trench MOSFET formed on an N+ type SiC substrate 201 with a less doped N type SiC epitaxial layer 202 extending thereon, wherein the N+ substrate 201 is coated with a back metal 220 of Ti/Ni/Ag on rear side as a drain metal. Inside the N epitaxial layer 202, a plurality of trenches having first type gate trenches 203 and second type gate trenches 204 are formed vertically downward from the top surface of the epitaxial layer 202 and not reaching the interface 216 between the N epitaxial layer 202 and the N+ substrate 201, wherein the width of the first type gate trenches 203 is greater than that of the second type gate trenches 204. A gate electrode 205 is disposed in upper portion of the first type gate trenches 203 and surrounded with a thick bottom oxide as the first insulating film 206 on bottom of the gate trenches 203, and surrounded with a second insulating film 209 on sidewalls of the gate trenches 203, wherein the second insulating film 209 has a less thickness than the first insulating film 206. The second type gate trenches 204 are filled up with the first insulating film 206. Between every two adjacent first type gate trenches 203, a p body region 210 with n+ source regions 211 thereon is extending near top surface of the N epitaxial layer 202 and surrounding the gate electrode 205 padded by the second insulating film 209. An interlayer dielectric film 221 is stacked on the epitaxial layer 202, and the source metal 212 is formed onto the contact interlayer 221. The p body regions 210, the n+ source regions 211 are further shorted to a source metal 212 comprising Ti/TiN/Al alloys through a plurality of trenched contacts 223 filled with contact plugs 213 comprising Ti/TiN/Al alloys and surrounded by p+ heavily doped regions 214 around bottoms underneath the n+ source regions 211. According to the invention, p* regions 215, which is adjacent to sidewalls of the second type gate trenches 204, are introduced into the N epitaxial layer 202 to form a SJ region, comprising a plurality of alternating p* regions 215 and N regions 202 above the N+ substrate 201. According to this embodiment, the SJ region is surrounding with at least lower portion of the second type gate trenches 204, and the p* regions 215 is above the bottom surface 216 of the N epitaxial layer 202. The p* regions 215 can be easily formed along sidewalls and bottoms of the second type gate trenches 204 by an angle ion-implantation or combination of a zero-degree ion implantation of boron through sidewalls and bottoms of the second type gate trenches 204, or by a BSG layer deposition procedure.

Figure 2B:
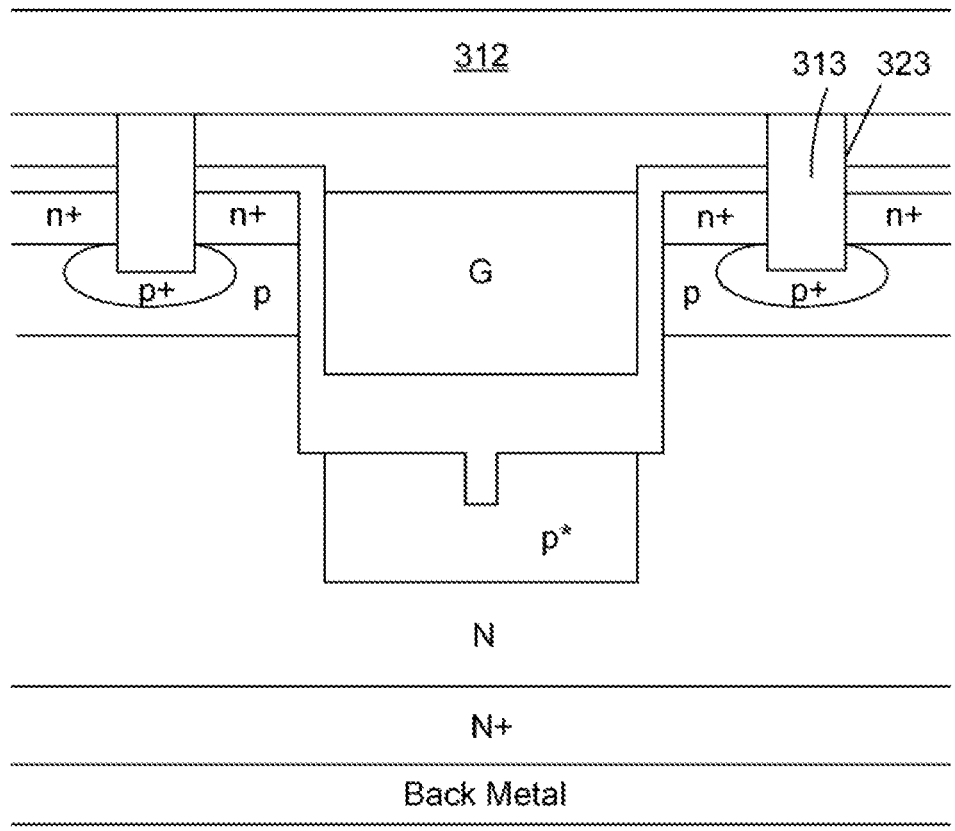
FIG. 2B is a cross-sectional view of another preferred embodiment according to the present invention.

Please refer to FIG. 2B for another preferred embodiment of the present invention, the trenched semiconductor power device has a similar structure to FIG. 2A, except that the trenched source contacts 323 in the present structure are filled with contact plugs 313 comprising Ti/TiN/W layers while the source metal 312 is comprising of Ti/TiN/Al Alloys.

Figure 3:
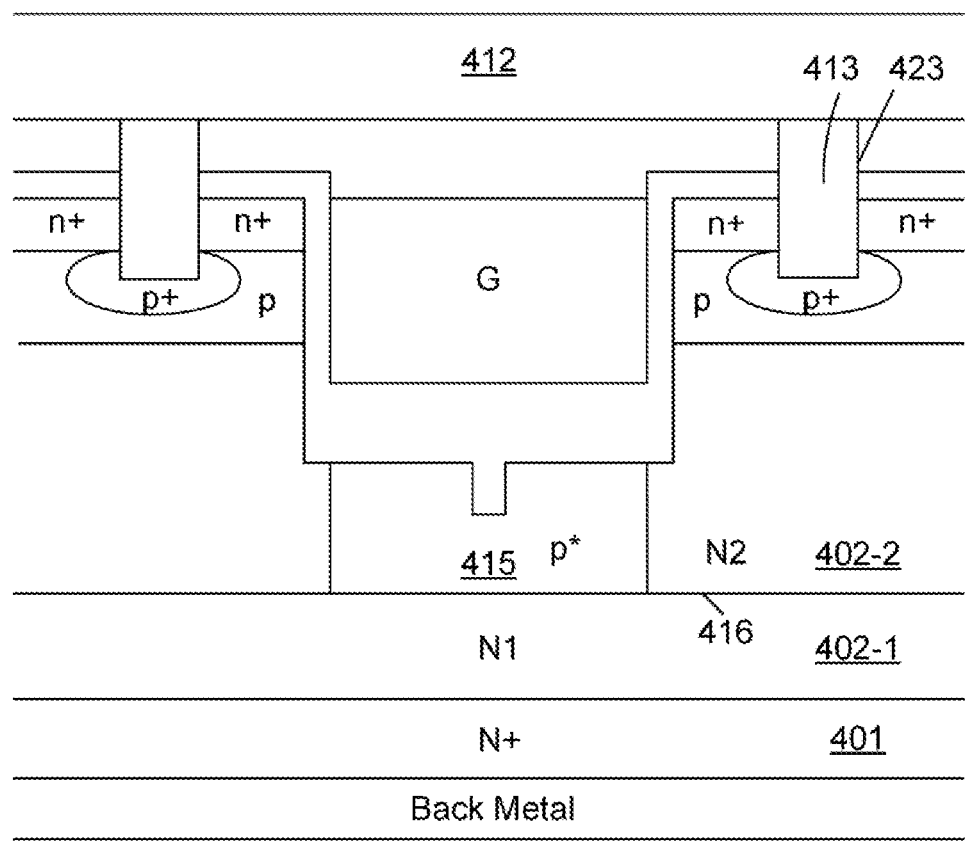
FIG. 3 is a cross-sectional view of another preferred embodiment according to the present invention.

Please refer to FIG. 3 for another preferred embodiment of the present invention, compared with FIG. 2B, the trenched semiconductor power device in FIG. 3 is formed in an epitaxial layer, which further comprises a lower N1 epitaxial layer 402-1 between the N+ substrate 401 and the SJ region with resistivity R1 and an upper N2 epitaxial layer 402-2 with resistivity R2, wherein R1<R2. Moreover, the SJ region comprises a plurality of alternating p* regions 415 and N2 regions 402-2 above the N1 epitaxial layer 402-1, wherein the p* regions 415 touch to bottom surface 416 of the upper N2 epitaxial layer 402-2. The trenched source contacts 423 in the present structure are filled with contact plugs 413 comprising Ti/TiN/W layers while the source metal 412 is Al Alloys.

Figure 4:
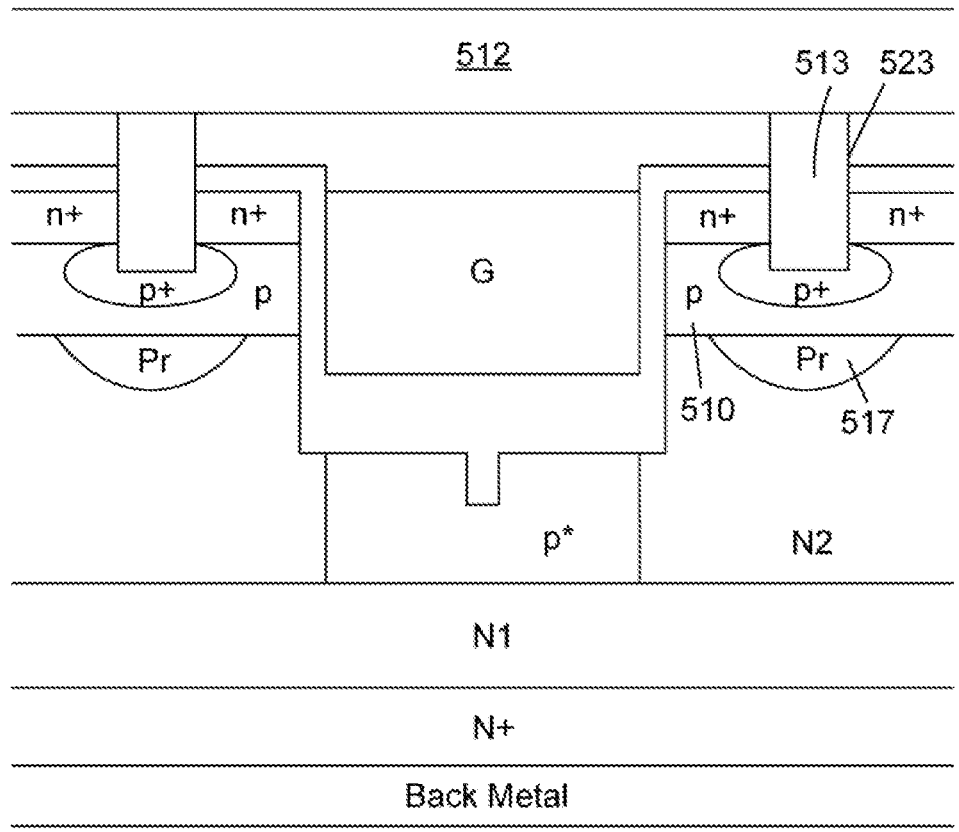
FIG. 4 is a cross-sectional view of another preferred embodiment according to the present invention.

Please refer to FIG. 4 for another preferred embodiment of the present invention, the trenched semiconductor power device has a similar structure to FIG. 3, except that the present structure further includes a p type gate oxide electric field reducing regions 517 (Pr, as illustrated) adjoining lower surfaces of the p body regions 510 and space apart from the trenches. The trenched source contacts 523 in the present structure are filled with contact plugs 513 comprising Ti/TiN/W layers while the source metal 512 is Al Alloys.

Figure 5A:
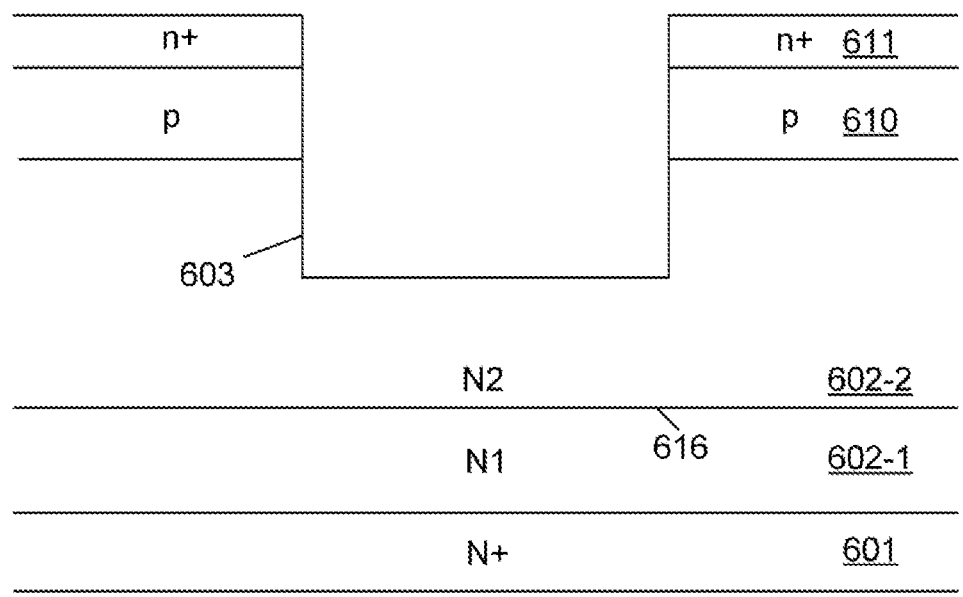
FIGS. 5A-5L are a serial of side cross-sectional views for showing the processing steps for fabricating the SiC SJ trench MOSFET of FIG. 4.

FIGS. 5A-5K are a serial of exemplary steps that are performed to form the invention embodiment of FIG. 4. In FIG. 5A, an epitaxial layer comprising of a lower N1 epitaxial layer 602-1 with resistivity R1 and an upper N2 epitaxial layer 602-2 with resistivity R2 (R1<R2) is grown onto a N+ type SiC substrate 601, wherein the epitaxial layer has a lower doping concentration than the N+ substrate 601. A p body region 610 and an n+ source region 611 are then formed into the N2 epitaxial layer 602-2 in active area. A hard mask 613 (not shown) such as an oxide layer is formed onto a top surface of the N2 epitaxial layer 602-2 for definition of areas for a plurality of first type gate trenches 603. Then, after dry oxide etch and dry silicon etch, a plurality of first type gate trenches 603 are formed penetrating through open regions in the hard mask, the N2 epitaxial layer 602-2, and not reaching the bottom surface 616 of N2 epitaxial layer 602-2. A sacrificial oxide layer (not shown) is first grown and then removed to eliminate the plasma damage after forming the gate trenches 603.

Figure 5B:
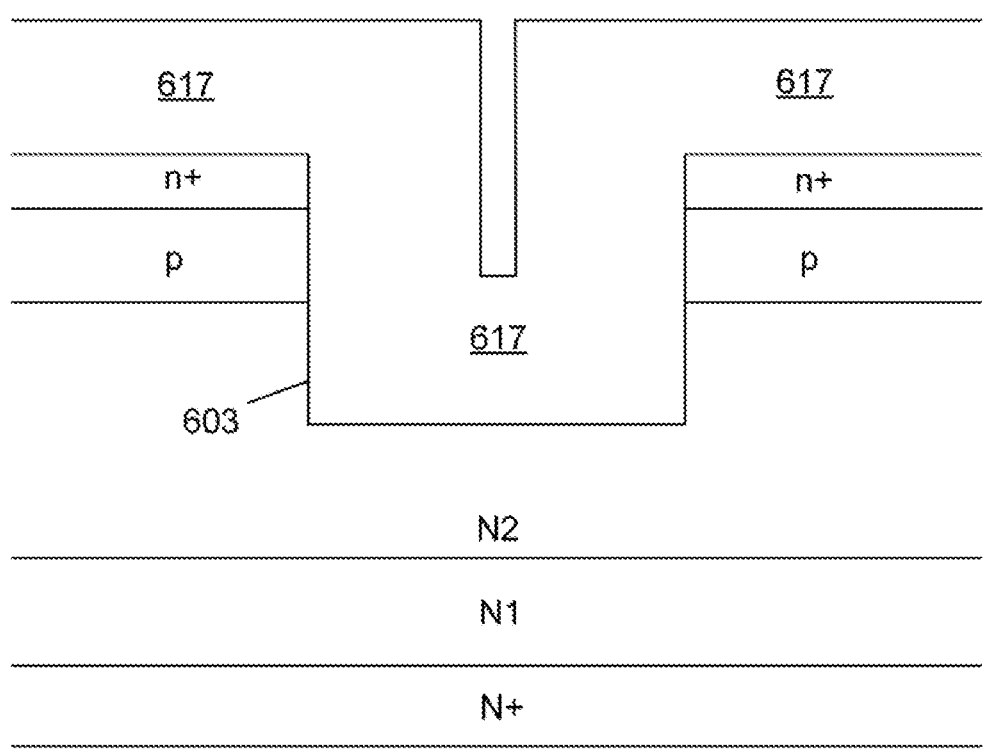

In FIG. 5B, a dielectric layer 617 is formed by oxide deposition or thermal oxide growing method on sidewalls and bottoms of the first type gate trenches 603.

Figure 5C:
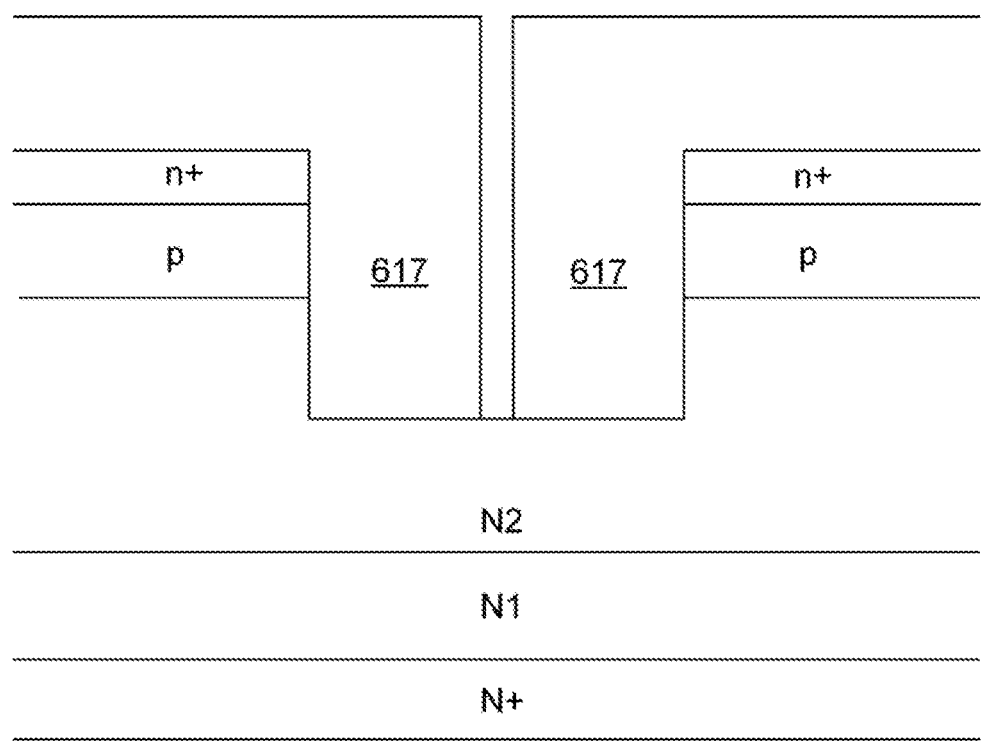

In FIG. 5C, dielectric layer on bottoms of the first type gate trenches 603 is removed by dry oxide etching.

Figure 5D:
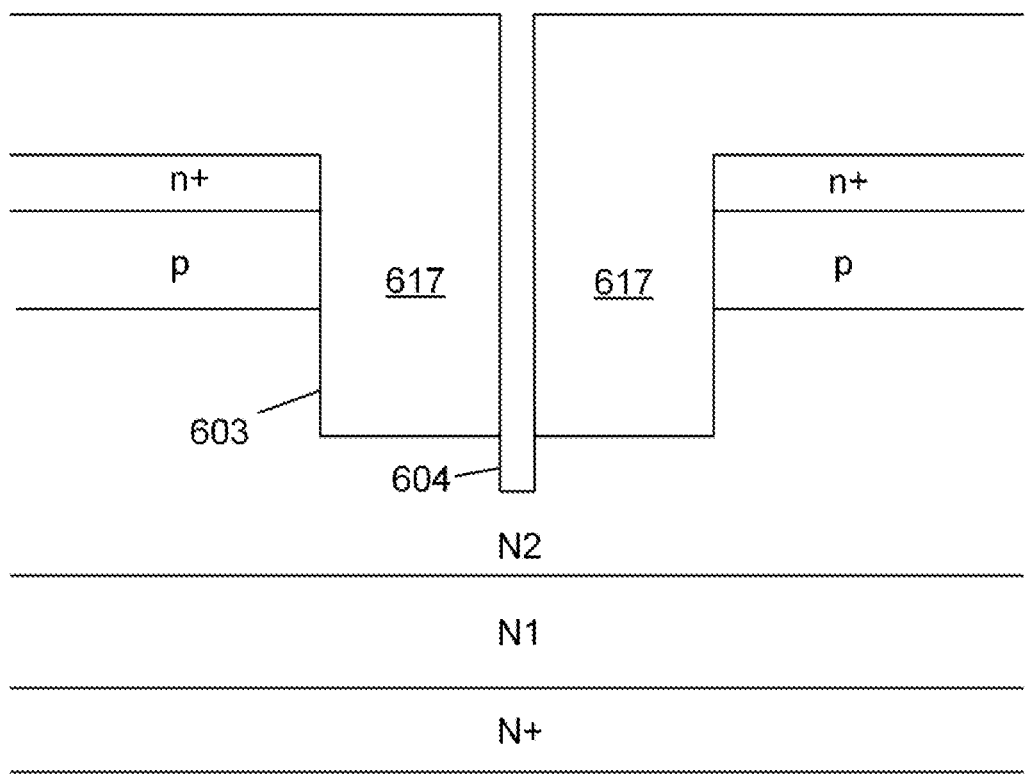

In FIG. 5D, an anisotropic silicon etch is performed to form a plurality of the second type gate trenches 604.

Figure 5E:
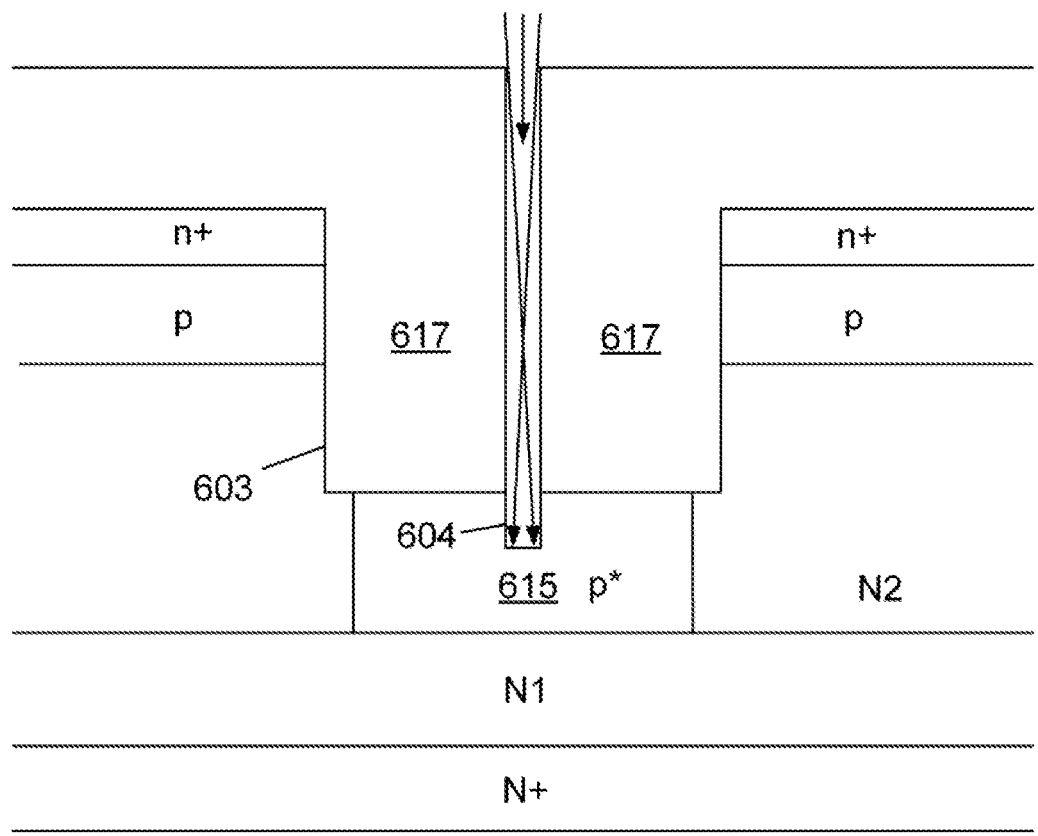

In FIG. 5E, an angle ion implantation into sidewalls and bottom of the second type gate trenches 604 and a diffusion step are successively carried out to form a p* region 615 surrounding the second type trenches 604. Moreover, combination of zero degree and angle boron ion implantation would be carried out if bottom of trench 604 is too narrow.

Figure 5F:
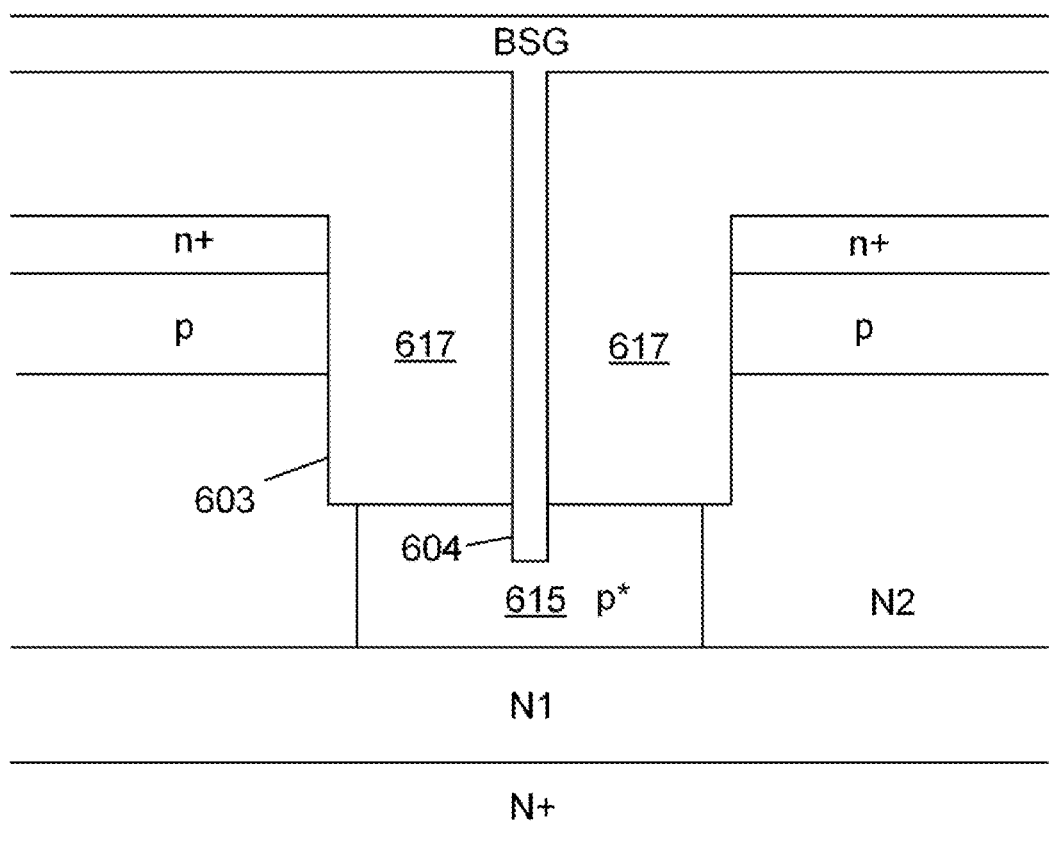

In FIG. 5F, a BSG layer is deposited into both the two type trenches to provide an alternate way to form a p* region 615 surrounding the second type gate trenches 604.

Figure 5G:
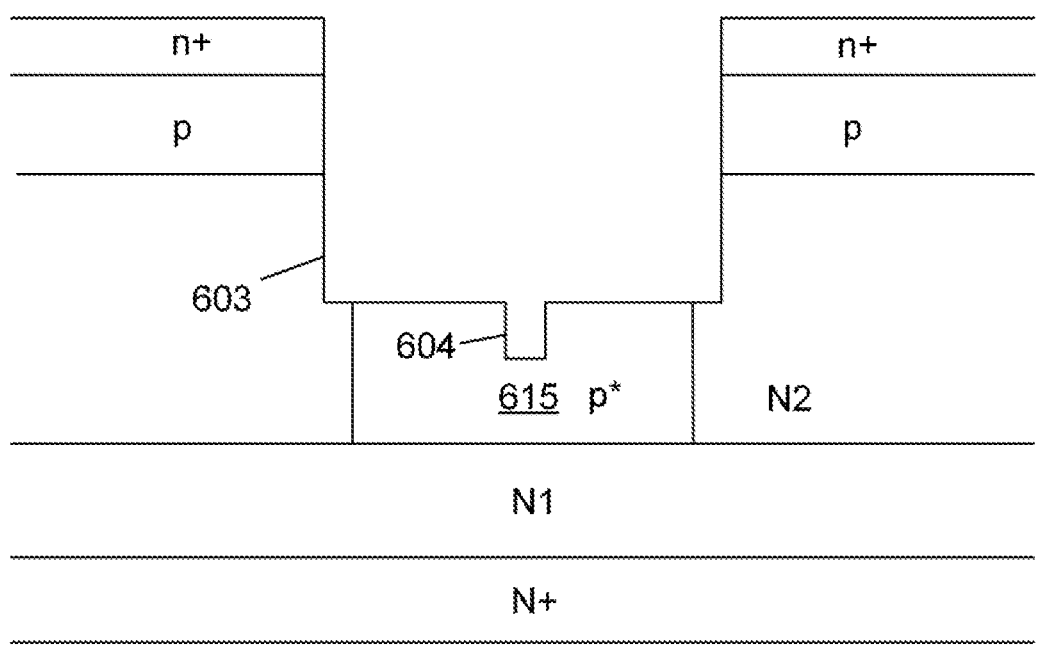

In FIG. 5G, the dielectric layer 617 is removed.

Figure 5H:
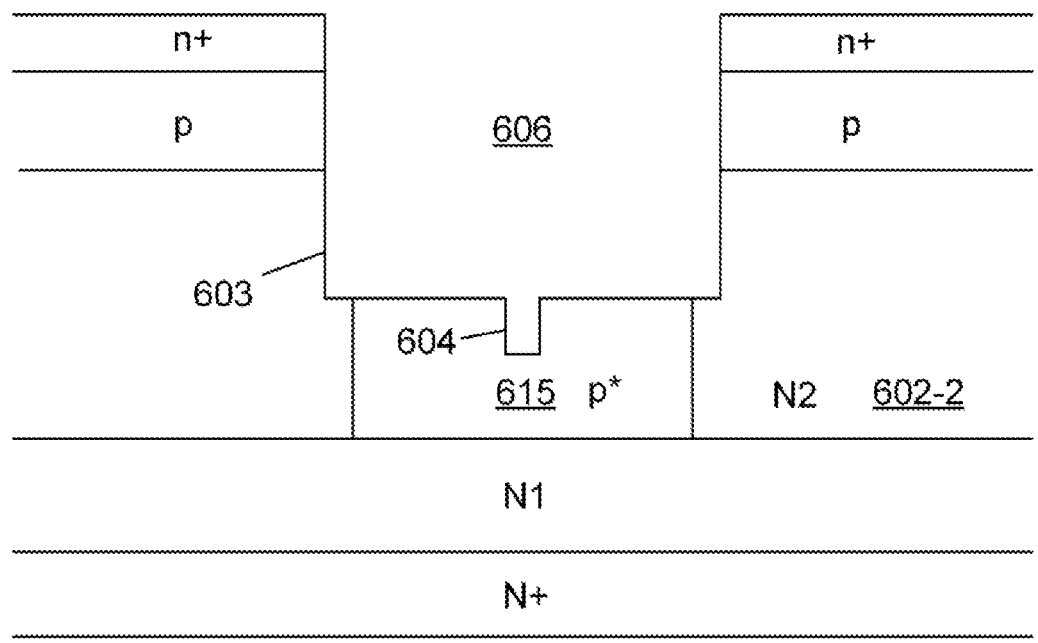

In FIG. 5H, a first insulating film 606 comprising a thick oxide layer is formed along inner surfaces of both the two type gate trenches 603 and 604 and top surface of upper epitaxial layer 602-2 by thermal oxide growth or thick oxide deposition, wherein the second type gate trenches 604 are filled up with the first insulating film 606.

Figure 5I:
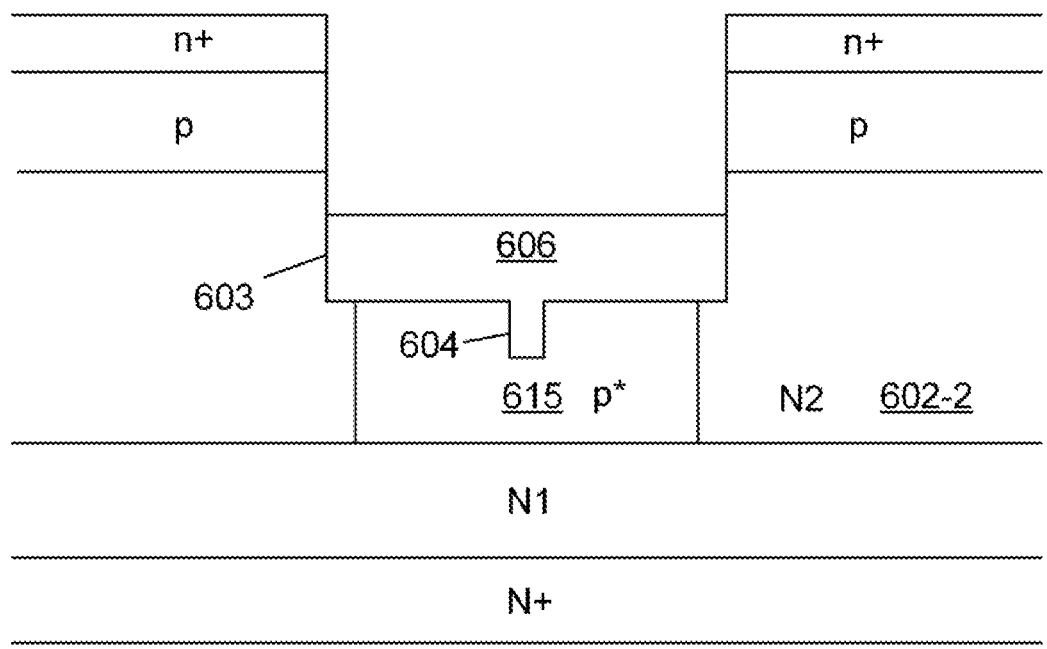

In FIG. 5I, the first insulating film 606 is etched back from top surface of the epitaxial layer 602-2, and the upper portion of the first type gate trenches 603.

Figure 5J:
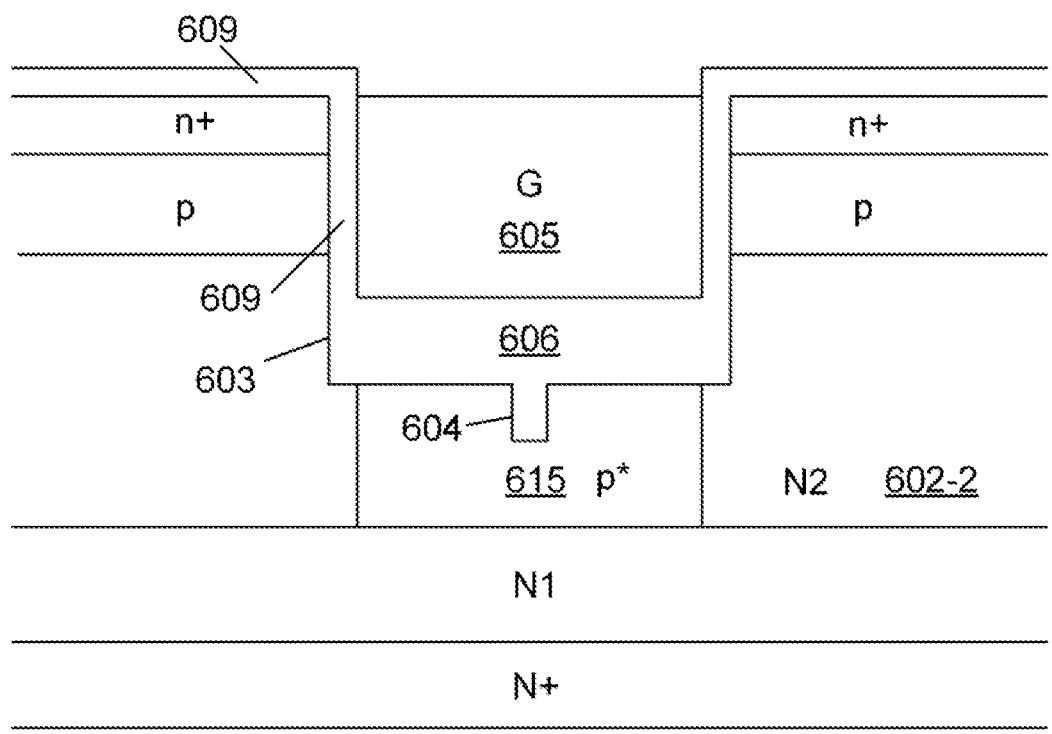

In FIG. 5J, the second insulating film 609 is then thermally grown or deposited along sidewalls of the first type gate trenches 603 and top surfaces of the N2 epitaxial layer 602-2 as a gate oxide, which is thinner than the first insulation layer 606. After that, a first doped poly-silicon layer is deposited onto the first gate insulating film 606 to fill the upper portions of the first type gate trenches 603, and then etched back by CMP (Chemical Mechanical Polishing) or Plasma Etch or Poly recess etch to serve as the single gate electrodes 605.

Figure 5K:
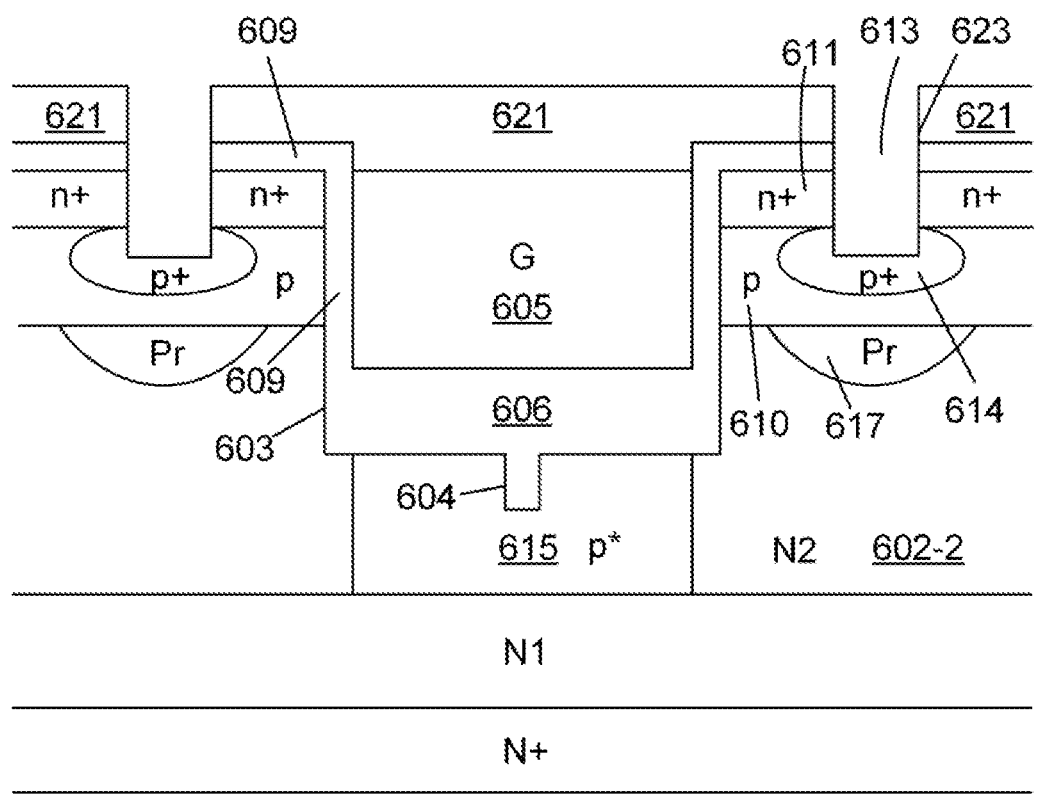

In FIG. 5K, a second dielectric layer such as combination of an undoped oxide layer and a BPSG layer is formed over the entire structure using conventional techniques. After applying a contact mask (not shown) onto the top surface of the epitaxial layer 602-2, the oxide layer is etched back to form the dielectric layer 621. After applying a contact mask (not shown) onto the contact interlayer 621, a plurality of trenched contacts 623 are formed by successively dry oxide etch and dry silicon etch penetrating through the contact interlayer 621, and extending into the p body regions 610 for trenched source-body contacts. A Boron Ion Implantation is performed to form a p type gate oxide electric field reducing region 617 (illustrated as Pr) adjoining lower surfaces of the p body region 610 and space apart from the trenches 603. Next, another BF2 Ion Implantation is performed to a p+ body contact doped region 614 within the p body regions 610 and surrounding at least bottom of the trenched source body-contacts penetrating through the n+ source region 611 and extending into the p body region 610, and then, a barrier metal layer of Ti/TiN is deposited on sidewalls and bottoms of all the trenched contacts 623 followed by a step of RTA process for silicide formation. Then, a tungsten material layer is deposited onto the barrier layer, wherein the tungsten material layer and the barrier layer are then etched back to form contact metal plug 613 comprising Ti/TiN/W for the trenched source-body contacts.

Figure 5L:
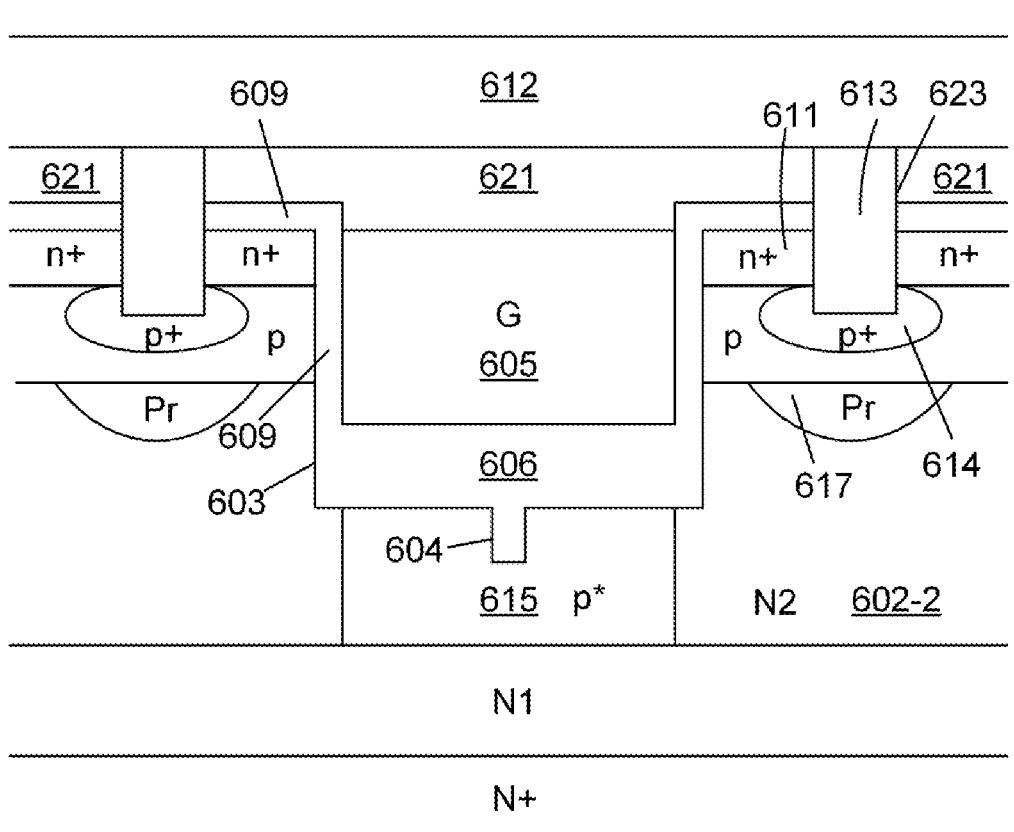

In FIG. 5L, a metal layer of Al alloys padded by a resistance-reduction layer Ti or Ti/TiN underneath is deposited onto the contact interlayer 621 and followed by a metal etching process by employing a metal mask (not shown) to be patterned as a source metal 612.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A SiC power device comprising a SJ trench MOSFET formed in an epitaxial layer of a first conductivity type onto a substrate of said first conductivity type, further comprising:
   a plurality of trenches surrounded by source regions of said first conductivity type encompassed in body regions of a second conductivity type near a top surface of said epitaxial layer in active area;
   each of said plurality of trenches having a first type gate trench and a second type gate trench; said first type gate trench is above said second type gate trench and has a trench width wider than said second type gate trench;
   a gate electrode disposed in said first type gate trench surrounded with a first insulating film on bottom of said plurality of trenches, and with a second insulating film on sidewalls of said plurality of trenches; said first insulating film having a thickness greater than said second insulating film;
   a super junction region surrounding with lower portions of said plurality of trenches, comprising a first doped column region of said second conductivity type formed adjacent to sidewalls of said second type gate trench and a second doped column region of said first conductivity type formed in parallel and surrounded with said first doped column region, said second type gate trench filled up with said first insulating film; and said body regions and said source regions being shorted to a source metal through a plurality of source contacts.

2. The SiC power device of claim 1, wherein said epitaxial layer comprises a single epitaxial layer having a uniform doping concentration.

3. The SiC power device of claim 1, wherein said epitaxial layer comprises a lower epitaxial layer between said substrate and said super junction region with resistivity R1 and an upper epitaxial layer with resistivity R2, wherein said R1<said R2.

4. The SiC power device of claim 1, wherein said source contacts are trenched contacts.

5. The SiC power device of claim 1, further comprising gate oxide electric field reducing regions of said second type conductivity adjoining lower surfaces of said body regions and spaced apart from adjacent said plurality of trenches.

6. The SiC power device of claim 4, wherein said source contacts filled with Ti/TiN/Al alloys.

7. The SiC power device of claim 4, wherein said source contacts filled with Ti/TiN/W.

* * * * *